(12) United States Patent
Ishikawa et al.

(10) Patent No.: US 7,122,830 B2
(45) Date of Patent: Oct. 17, 2006

(54) SEMICONDUCTOR DEVICE AND METHOD OF MANUFACTURING THE SAME

(75) Inventors: Akira Ishikawa, Atsugi (JP); Yasumori Fukushima, Fukuyama (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 10/717,562

(22) Filed: Nov. 21, 2003

(65) Prior Publication Data

US 2004/0113142 A1   Jun. 17, 2004

(30) Foreign Application Priority Data

Nov. 29, 2002   (JP) ............... 2002-347320

(51) Int. Cl.
  *H01L 29/04* (2006.01)
  *H01L 29/15* (2006.01)
(52) U.S. Cl. ............... 257/59; 257/72; 257/20; 257/258; 257/E51.005; 438/48; 438/128; 438/149; 438/151; 438/157; 438/283; 349/38; 349/39; 349/151
(58) Field of Classification Search ............... 257/59, 257/20, 258, 72, 67, E27.132, E29.151, E23.144, 257/758, E51.055; 438/48, 128, 149, 151, 438/157, 283; 349/38, 42, 43, 44, 46, 39, 349/151
See application file for complete search history.

(56) References Cited

U.S. PATENT DOCUMENTS

| | | | |
|---|---|---|---|
| 5,712,495 A | 1/1998 | Suzawa | |
| 6,124,604 A | 9/2000 | Koyama et al. | |
| 6,271,543 B1 | 8/2001 | Ohtani et al. | |
| 6,836,428 B1 | 12/2004 | Nakura et al. | |
| 6,842,214 B1 | 1/2005 | Zhang | |
| 2003/0203454 A1* | 10/2003 | Chotani et al. | ............. 435/105 |
| 2004/0029338 A1* | 2/2004 | Yamazaki et al. | .......... 438/202 |

FOREIGN PATENT DOCUMENTS

| | | |
|---|---|---|
| JP | 09-43630 | 2/1997 |
| JP | 09-312260 | 12/1997 |

* cited by examiner

*Primary Examiner*—Kenneth Parker
*Assistant Examiner*—Joseph Nguyen
(74) *Attorney, Agent, or Firm*—Nixon Peabody LLP; Jeffrey L. Costellia

(57) ABSTRACT

The present invention provides a semiconductor device wherein the area of a peripheral circuit region with respect to a pixel region is reduced, and provides a manufacturing method of the semiconductor device. A semiconductor device according to the present invention is characterized by having a pixel region 1, peripheral circuit regions 2a to 2c arranged in at least a part of the periphery of the pixel region, and a wiring formed in the peripheral circuit region, and by having a wiring multilayered with two or more layers. At least one layer of the multilyered wiring is formed from a low resistance material. Transistors are formed in the peripheral circuit region, and the multilayer wiring with two or more layers is formed on the upper side of the transistors.

6 Claims, 6 Drawing Sheets

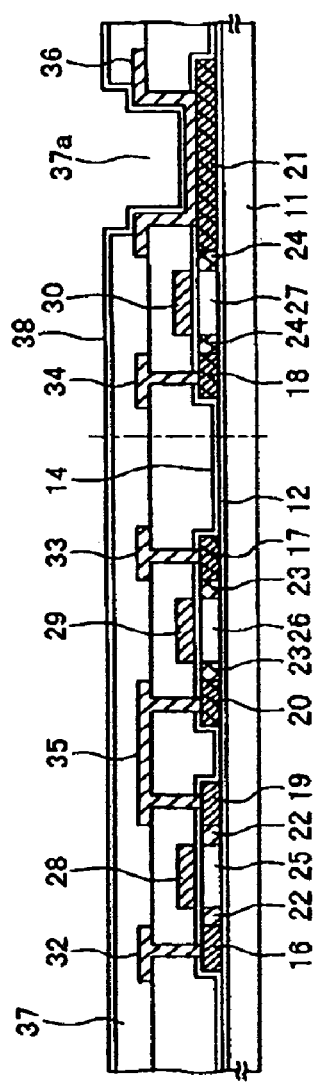
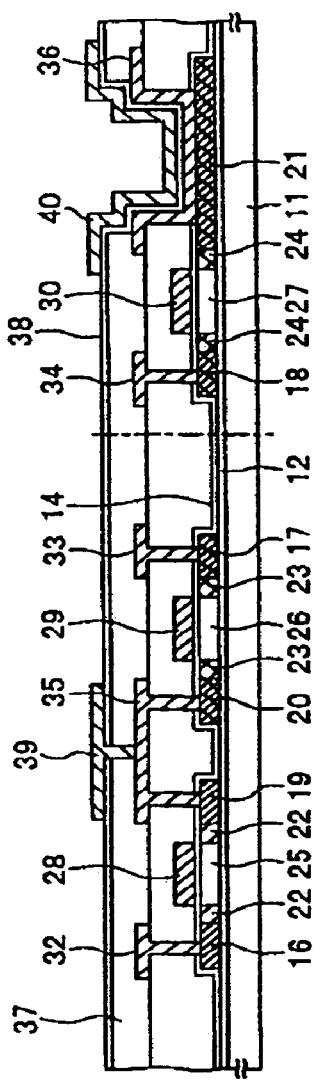
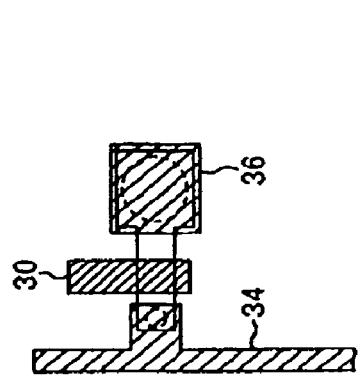
FIG.3A
FIG.3B

Prior Art

SEMICONDUCTOR DEVICE AND METHOD OF MANUFACTURING THE SAME

BACKGROUND OF THE INVENTION

1. Field of the Invention

The present invention relates to a semiconductor device and a method of manufacturing the semiconductor device, and more specifically to a technique of reducing the area of a peripheral circuit region with respect to a pixel region that has one or more pixels. The present invention also relates to a technique of improving an aperture ratio of the pixel region by giving the peripheral circuit region ("border frame") a smaller width through a multilayer wiring.

2. Description of the Related Art

FIG. 6 is a plan view schematically showing a chip in a conventional liquid crystal display device.

This chip in the liquid crystal display device has a pixel region 101, which has a square shape in plan view. The pixel region 101 is composed of one or more pixels. Placed in the periphery (above, to the left, and to the right) of the pixel region 101 are peripheral circuits 102a to 102c. The chip is arranged on a substrate (or this chip and similar chips are arranged on the same substrate). The peripheral circuits 102a to 102c each have a thin rectangular shape in plan view, and the shorter sides of each rectangular are 2 to 3 mm in length. The reason each of the peripheral circuits needs a width of 2 to 3 mm is because power supply lines, clock lines, and other wirings formed in the peripheral circuit are on the order of tens to hundreds of μm in width, thus taking up a large area.

The peripheral circuits 102a to 102c have TFTs (thin film transistors). Those TFTs have gate electrodes formed from a refractory metal such as polysilicon or W. The gate electrodes are for applying a gate voltage to specific TFT active layers, and the gate electrodes of the plural TFTs are electrically connected with one another. The gate electrodes are electrically connected to intersecting wirings. The wirings electrically connect the plural TFTs with one another, and are placed in a layer above the gate electrodes. The wirings also connect the TFTs to pixel electrodes. The wirings have a laminated structure composed of, for example, an Al film and a barrier metal film. The barrier metal film is a single layer or a multilayer structure of Ti, TiN, Ta, TaN, W, or the like.

Formed in a layer above the wiring layer is a black mask, which is an Al film or the like. The black mask has a light-shielding function and an electric potential blocking ability. A pixel electrode is formed from ITO in a layer above the black mask.

[Reference 1: JP 09-43630 A]

As mentioned above, the peripheral circuit region (the peripheral circuits constituting a "border frame" around the pixel region) has a width of 2 to 3 mm. Because, the peripheral circuit region is desired to have a narrower width because reduction in width of the peripheral circuit region (border frame) leads to an improvement in aperture ratio of the pixel region. To elaborate, reduction in width of the peripheral circuit region gives the pixel region a larger area when the chip size is equal and accordingly the area of each pixel is increased, thus increasing the area of the aperture in each pixel and improving the brightness. On the other hand, when the pixel region has the same area, reduction in width of the peripheral circuit region makes it possible to reduce the chip size and the chip becomes more suitable for mass production.

In the conventional liquid crystal display device described above, the wiring layer is a single layer and raising the degree of integration in the wiring layer is difficult due to limitations of a photolithography system or the like. When wirings are formed in the same layer, the wirings take up a large area and the proportion of the area of the driver circuit and other peripheral circuits to the entire chip area is accordingly large, presenting an obstacle to reduction in width of the peripheral circuit region.

When the peripheral circuit region has a large width, the wirings electrically connecting plural pixels with one another also tend to have an extended length since the wirings run across the pixel region. This could result in higher-than-ideal resistance for the wirings and a shortage of current to be supplied to the TFTs.

In addition, the gate electrodes formed in a layer below the wirings tend to be made thicker in order to lower the resistance of the gate electrodes. Thicker gate electrodes increase the level difference in the base of the wiring layer to reduce the patterning margin in forming the wirings. This could result in level discontinuity in the wirings patterned.

SUMMARY OF THE INVENTION

The present invention has been made in view of the above circumstances, and an object of the present invention is therefore to provide a technique for reducing the area of a peripheral circuit region with respect to a pixel region. In particular, an object of the present invention is to improve the aperture ratio of the pixel region by giving the peripheral circuit region ("border frame") a smaller width through a multilayer wiring.

In order to solve the above-mentioned problems, according to the present invention, there is provided a semiconductor device including:

a pixel region;

a peripheral circuit region placed in at least a part of an area surrounding the pixel region; and a wiring formed from a low resistance material in the peripheral circuit region.

According to the above semiconductor device, the wiring in the peripheral circuit region is formed from a low resistance material, thereby giving the wiring a smaller width. Therefore, the area of the peripheral circuit region with respect to the area of the pixel region can be reduced.

According to the present invention, there is provided a semiconductor device including:

a pixel region;

a peripheral circuit region placed in at least a part of an area surrounding the pixel region; and a wiring formed in the peripheral circuit region, in which the wiring is a multilayer wiring having two or more layers.

According to the above semiconductor device, the wiring formed in the peripheral circuit region is a multilayer wiring and therefore the peripheral circuit region (border frame) is given a smaller width. In this way, the pixel region can have an improved aperture ratio.

According to the present invention, there is provided a semiconductor device including:

a pixel region;

a peripheral circuit region placed in at least a part of an area surrounding the pixel region;

gate electrodes of TFTs formed in the peripheral circuit region; and a wiring formed in a layer above or below the gate electrodes and connected to the gate electrodes, in which the gate electrodes in different TFTs are isolated from one another.

Further, in the semiconductor device according to the present invention, the wiring is preferably a multilayer wiring having two or more layers.

According to the present invention, there is provided a semiconductor device including:

a pixel region;

a peripheral circuit region placed in at least a part of an area surrounding the pixel region;

gate electrodes of TFTs formed in the peripheral circuit region; and a short distance wiring formed in a layer above or below the gate electrodes and connected to the gate electrodes, in which the gate electrodes in different TFTs are isolated from one another.

Further, in the semiconductor device according to the present invention, the short distance wiring may be a wiring led in a pixel or a wiring for leading one functional block.

Further, in the semiconductor device according to the present invention, the short distance wiring is preferably 2 μm or longer and shorter than 2 cm.

Further, in the semiconductor device according to the present invention, the short distance wiring may be a multilayer wiring having two or more layers.

Further, the semiconductor device according to the present invention may further include a long distance wiring that is formed in a layer above the short distance wiring.

According to the present invention, there is provided a semiconductor device including:

a pixel region;

a peripheral circuit region placed in at least a part of an area surrounding the pixel region;

gate electrodes of TFTs formed in the peripheral circuit region; and a long distance wiring formed in a layer above or below the gate electrodes, in which the gate electrodes in different TFTs are isolated from one another.

Further, in the semiconductor device according to the present invention, the long distance wiring may be hundred times or more times longer than the pixel pitch,.

Further, in the semiconductor device according to the present invention, the long distance wiring is preferably 2 cm or longer and shorter than 10 cm.

Further, in the semiconductor device according to the present invention, the long distance wiring may be a multilayer wiring having two or more layers.

Further, in the semiconductor device according to the present invention, it is preferable that at least one of the layers of the multilayer wiring be formed from a low resistance material.

Further, in the semiconductor device according to the present invention, the low resistance material may be one or more materials selected from the group consisting of copper, a copper alloy, gold, a gold alloy, silver, and a silver alloy.

Further, in the semiconductor device according to the present invention, a transistor may be formed in the peripheral circuit region, and a multilayer wiring having two or more layers may be formed over the transistor.

According to the present invention, there is provided a method of manufacturing a semiconductor device, including:

forming a driver circuit TFT in a driver circuit region on a substrate and a pixel TFT in a pixel region on the substrate; and forming a first wiring above the driver circuit TFT, a second wiring above the first wiring, and a third wiring above the second wiring, and forming a first capacitor element on a drain region of the pixel TFT and a second capacitor element on the first capacitor element.

According to the above method of manufacturing a semiconductor device, the first through third wirings are formed over the driver circuit TFT and the first and second capacitor elements are formed on the drain region of the pixel TFT. Therefore, the pixel region can have an improved aperture ratio.

According to the present invention, there is provided a semiconductor device including:

a driver circuit TFT formed in a driver circuit region on a substrate;

a pixel TFT formed in a pixel region on the substrate;

a first wiring formed above the driver circuit TFT;

a second wiring formed above the first wiring;

a third wiring formed above the second wiring;

a first capacitor element formed on a drain region of the pixel TFT; and a second capacitor element formed on the first capacitor element.

According to the present invention, there is provided a method of manufacturing a semiconductor device, including:

forming a driver circuit TFT in a driver circuit region on a substrate and a pixel TFT in a pixel region on the substrate;

forming a first interlayer insulating film on the driver circuit TFT and the pixel TFT;

forming a first contact hole in a portion of the first interlayer insulating film that is in the pixel region, the first contact hole being positioned on a drain region of the pixel TFT;

forming, from a first conductive film, a first wiring on a portion of the first interlayer insulating film that is in the driver circuit region, and forming a drain electrode in the first contact hole from the first conductive film;

forming a second interlayer insulating film on the first wiring, the drain electrode, and the first interlayer insulating film;

forming a second contact hole in a portion of the second interlayer insulating film that is in the pixel region, the second contact hole being positioned on the first contact hole and the drain electrode;

forming a third interlayer insulating film on the second interlayer insulating film and in the second contact hole;

forming, from a second conductive film, a second wiring on a portion of the third interlayer insulating film that is in the driver circuit region, and forming a first capacitor electrode in the second contact hole from the second conductive film;

partially exposing the third interlayer insulating film at the bottom of the second contact hole by etching the first capacitor electrode;

forming a fourth interlayer insulating film on the second wiring, the first capacitor electrode, and the third interlayer insulating film;

forming a third contact hole in a portion of the fourth interlayer insulating film that is in the pixel region, the third contact hole being positioned on the second contact hole and the first capacitor electrode;

forming a fifth interlayer insulating film on the fourth interlayer insulating film and in the third contact hole;

partially exposing the drain electrode positioned under the bottom of the third contact hole by etching portions of the third and fifth interlayer insulating films that are at the bottom of the third contact hole; and forming, from a third conductive film, a third wiring on a portion of the fifth interlayer insulating film that is in the driver circuit region, as well as forming a second capacitor electrode in the third contact hole from the third conductive film and electrically connecting the second capacitor electrode to the drain electrode, in which a first capacitor element and a second capacitor element are formed in the first through third contact holes, the first capacitor element being composed of the drain electrode, the third interlayer insulating film as a dielectric, and the first capacitor electrode, the second capacitor element being composed of the first capacitor electrode, the fifth interlayer insulating film as a dielectric, and the second capacitor electrode.

Further, in the method of manufacturing a semiconductor device according to the present invention, electrically connecting the second capacitor electrode to the drain electrode may be followed by forming a sixth interlayer insulating film on the third wiring, the second capacitor electrode, and the fifth interlayer insulating film, and forming, on a portion of the fifth interlayer insulating film that is in the pixel region, a pixel electrode that is electrically connected to the second capacitor electrode.

According to the present invention, there is provided a semiconductor device, including:

a driver circuit TFT formed in a driver circuit region on a substrate and a pixel TFT formed in a pixel region on the substrate;

a first interlayer insulating film formed on the driver circuit TFT and the pixel TFT;

a first contact hole formed in a portion of the first interlayer insulating film that is in the pixel region, the first contact hole being positioned on a drain region of the pixel TFT;

a first wiring formed from a first conductive film on a portion of the first interlayer insulating film that is in the driver circuit region;

a drain electrode formed in the first contact hole from the first conductive film;

a second interlayer insulating film formed on the first wiring, the drain electrode and the first interlayer insulating film;

a second contact hole formed in a portion of the second interlayer insulating film that is in the pixel region, the second contact hole being positioned on the first contact hole and the drain electrode;

a third interlayer insulating film formed on the second interlayer insulating film and in the second contact hole;

a second wiring formed from a second conductive film on a portion of the third interlayer insulating film that is in the driver circuit region;

a first capacitor electrode formed in the second contact hole from the second conductive film;

a hole for partially exposing the third interlayer insulating film at the bottom of the second contact hole, the hole being formed in the first capacitor electrode;

a fourth interlayer insulating film formed on the second wiring, the first capacitor electrode, and the third interlayer insulating film;

a third contact hole formed in a portion of the fourth interlayer insulating film that is in the pixel region, the third contact hole being positioned on the second contact hole and the first capacitor electrode;

a fifth interlayer insulating film formed on the fourth interlayer insulating film and in the third contact hole;

a hole for partially exposing the drain electrode positioned under the bottom of the third contact hole, the hole being formed in portions of the third and fifth interlayer insulating films that are at the bottom of the third contact hole; and a third wiring formed from a third conductive film on a portion of the fifth interlayer insulating film that is in the driver circuit region;

a second capacitor electrode formed in the third contact hole from the third conductive film electrically connected to the drain electrode, in which a first capacitor element and a second capacitor element are formed in the first through third contact holes, the first capacitor element being composed of the drain electrode, the third interlayer insulating film as a dielectric, and the first capacitor electrode, the second capacitor element being composed of the first capacitor electrode, the fifth interlayer insulating film as a dielectric, and the second capacitor electrode.

Further, the semiconductor device according to the present invention may further include: a sixth interlayer insulating film formed on the third wiring, the second capacitor electrode, and the fifth interlayer insulating film; and a pixel electrode formed on a portion of the fifth interlayer insulating film that is in the pixel region and is electrically connected to the second capacitor electrode.

BRIEF DESCRIPTION OF THE DRAWINGS

FIGS. 3A and 3B show a step next to the one shown in FIG. 2C, and they show cross sections of a drive circuit region and a pixel region, and a top view of the pixel region of a liquid crystal display device.

DETAILED DESCRIPTION OF THE PREFERRED EMBODIMENTS

Embodiment modes and Embodiment of the present invention are described below with reference to the accompanying drawings.

Embodiment Mode 1

Figure 1:
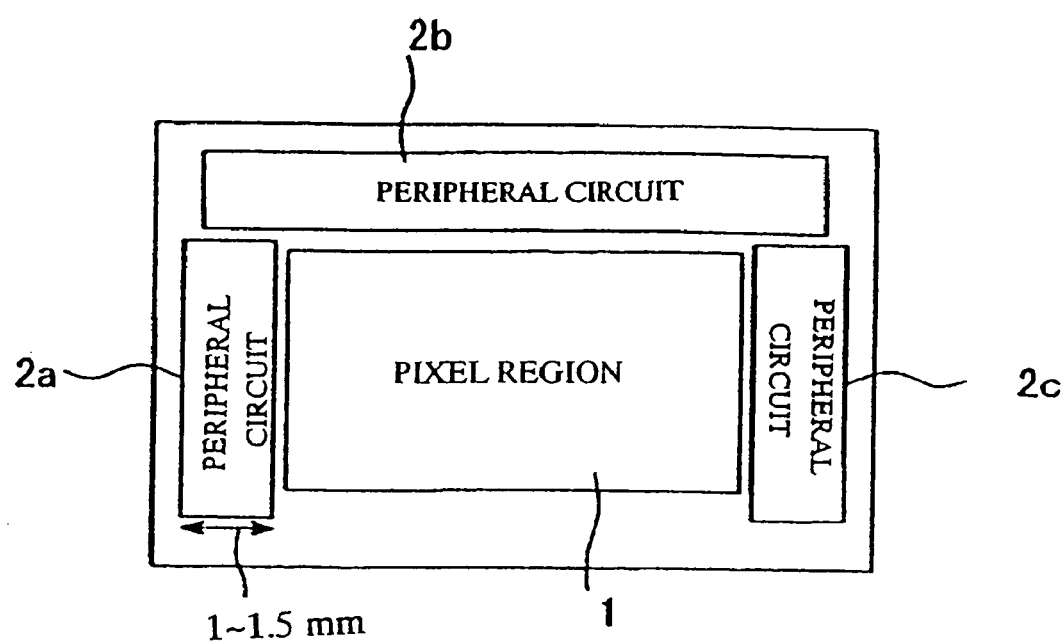
FIG. 1 shows a frame format of a chip in the liquid crystal display device according to Embodiment Mode 1.

FIG. 1 is a plan view schematically showing a chip in a liquid crystal display device of Embodiment Mode 1 according to the present invention.

This chip in the liquid crystal display device has a pixel region 1, which has a substantially square shape in plan view. The pixel region 1 is composed of one or more pixels. Placed in the periphery (above, to the left, and to the right) of the pixel region 1 are peripheral circuits 2a to 2c. Chips like this are arranged on a substrate. The peripheral circuits 2a to 2c each have a substantially thin rectangular shape in plan view, and the shorter sides of each rectangular are 1 to 1.5 mm in length. The peripheral circuits 2a to 2c therefore have a smaller width than in conventional liquid crystal display devices.

In order to give the peripheral circuits a smaller width and reduce the area of the peripheral circuit region (border frame) with respect to the area of the pixel region to improve the aperture ratio, methods described below can be employed.

A first method is to reduce the line width of a wiring by forming the wiring from a wiring material that has lower resistance than conventional wiring materials (for example, a single layer or a multilayer of Al or an alloy containing Al). With a wiring formed from a low resistance material, an increase in wiring resistance can be suppressed when the line width of the wiring is reduced. Examples of low resistance material include: copper, a copper alloy, gold, a gold alloy, silver, and a silver alloy.

A second method is a multilayer wiring to give a wiring two or more layers. In this case, an Al-based wiring material may be used. Examples of Al-based wiring material include Al and an Al alloy. Of a multilayer wiring having two or more layers, at least one layer may be formed from a low resistance wiring material. A multilayer wiring having two or more layers may be placed above a transistor.

The area of wirings in the peripheral circuits can be reduced by the first or second method described above. This makes it possible to increase the pixel size without changing the chip size of a liquid crystal panel and therefore the brightness is improved. On the other hand, when the area of the pixel region is to remain the same, the chip size can be reduced while the number of chips formed on one substrate increased and the chip becomes more suitable for mass production.

In prior art, power supply lines, clock lines, and other wirings formed in the peripheral circuit region are arranged two-dimensionally in a single layer so that the wirings become longer and the projected area of the wirings accordingly becomes larger. In contrast, this embodiment mode uses multilayer wirings having two or more layers, so that wirings can be placed on a driver circuit and the projected area of the wirings can be reduced accordingly. In addition, this embodiment mode employs a low resistance material in the wirings to make the width of the wirings even narrower.

Prior art uses a single wiring having a large line width for each of power supply lines, clock lines, or the like, and this too makes the projected area of the wirings large. Correspondingly, in this embodiment mode, power supply lines, clock lines, or other wirings are formed from a combination of wirings that have a small line width, and the narrow wirings are arranged three-dimensionally for a multilayer wiring. The projected area of the wirings is thus reduced. In addition, by employing a low resistance material for the wirings, the width of the wirings can be even narrower.

Prior art has a wiring structure wherein a large number of wirings are arranged in parallel with one another, and this wiring structure makes the projected area of the wirings large. Correspondingly, in this embodiment mode, the number of wirings per layer can be reduced by multilayer wiring and therefore the projected area of the wirings can be reduced. In addition, by employing a low resistance material for the wirings, the width of the wirings can be even narrower.

As shown in FIG. 1, the width of the peripheral circuits 2a to 2c is reduced to half the width of prior art by the methods described above. For instance, if the peripheral circuit width is 2 mm in prior art, the width can be reduced to 1 mm in this embodiment mode. Then, an increase of about 2 µm per pixel is possible and, if the pixel pitch is 18 µm in prior art, the pitch can be raised to 20 µm in this embodiment mode.

Embodiment Mode 2

Described next is a liquid crystal display device according to Embodiment Mode 2 of the present invention.

In this embodiment mode, gate electrodes of TFTs are formed isolatedly from one another. In other words, a gate electrode in a TFT and a gate electrode in another TFT are formed separately. This means that, instead of leading a wiring which is in the same layer as a gate electrode and which is connected to the gate electrode, a wiring formed in an upper or lower layer of a gate electrode is electrically connected to the gate electrode and led. This eliminates the need to lower the resistance of the gate electrode and makes it possible to thin the gate electrode. An example of the lower layer wiring is a wiring interposed between a substrate and a Si active layer. Materials that are employable for the gate electrode are $N^+$ polysilicon and a refractory metal the same as in prior art. By thus thinning the gate electrode, level differences caused by the thickness of the gate electrode can be reduced. This makes it easier to level an insulating film on the gate electrode and facilitates the formation of a wiring in a layer above the gate electrode.

Embodiment Mode 3

Next, a description is given on a liquid crystal display device according to Embodiment Mode 3 of the present invention.

In this embodiment mode, a gate electrode is only given the function of a gate electrode and formed not to have the function of a wiring by isolating a gate electrode in one TFT from a gate electrode in another TFT. A wiring is formed in an upper or lower layer of a gate electrode and is electrically connected to the gate electrode to give the wiring the wiring function of the gate electrode in prior art as well as the function of a short distance wiring, one of the wirings of prior art that has a short wiring length. Similar to Embodiment Mode 2, an example of the lower layer wiring is a wiring interposed between a substrate and a Si active layer.

As described, by taking the wiring function away from the gate electrode of prior art and giving this function to a wiring in a layer above the gate electrode, this embodiment mode makes it possible to use for the wiring in the layer above the gate electrode a material that is not resistant to thermal activation unlike prior art where the gate electrode has to be formed from a material that can withstand thermal activation. Therefore, the range of selection of wiring material is widened. For instance, aluminum, an alloy containing aluminum, copper, an alloy containing copper, gold, an alloy containing gold, silver, or an alloy containing silver may be chosen as a wiring material.

The short distance wiring is, for example, in a liquid crystal display device, a wiring that is equal to or longer than a wiring led out in one pixel and is equal to or shorter than a wiring for leading one functional block. Typically, the short distance wiring is 2 µm or longer and shorter than 2 cm in length. Examples of short distance wirings include wirings for electrically connecting several to several tens TFTs with one another, wirings for electrically connecting those TFTs to wirings, wirings for electrically connecting the wirings, which are electrically connected to the TFTs, with one another, wirings led out in a functional block of a driver circuit, and conductive films for electrically connecting active layers to source electrodes or to drain electrodes.

Another example of the short distance wiring is a wiring that are used only for leading wirings of a gate electrode, a source region, and a drain region in a relatively narrow range. The "relatively narrow range" means the inside of a functional block (typically, inside a shift register circuit, a level shifter circuit, a buffer circuit, or a sampling circuit). Resistance of the short distance wiring has no need to be lowered when used to lead such wirings, and this allows the short distance wiring to be thin. By employing thinned short distance wirings, the parasitic capacitance between the short distance wirings in the same layer can be reduced and therefore an increase in parasitic capacitance can be suppressed when the degree of wiring integration is raised. One obstacle to higher degree of wiring integration is thus removed.

Preferably, the short distance wiring is layered for multilayer wiring. In view of the projected area of a wiring pattern, a multilayer wiring of the short distance wiring pushes the degree of wiring integration beyond limitations put by photolithography system or the like and therefore the area wirings take up is positively reduced. In addition, multilayer wiring makes the wiring length shorter and therefore it is possible to suppress an increase in parasitic capacitance between short distance wirings in different layers.

If the short distance wiring has a laminated structure composed of an Al layer and a barrier metal layer, or has a barrier metal layer alone, the short distance wiring can be thinned. With the wiring structure of this embodiment mode, a lead out wiring of a gate electrode may employ a material that has lower resistance than conventional materials in some cases.

It is preferable to place a long distance wiring in a layer above the short distance wiring. A long distance wiring is an independent wiring which is required to have a long wiring length and which is layered for multilayer wiring. For instance, in a liquid crystal display device, a long distance wiring has a length 100 times longer than the pixel pitch, or more. Typically, gate electrodes, gate wirings, source wirings, and drain wirings which run across or down the entire pixel region are long distance wirings. Specifically, a long distance wiring is equal to and longer than 2 cm and equal to or shorter than 10 cm. Examples of long distance wirings include wirings for electrically connecting hundreds to thousands of TFTs with one another, wirings for electrically connecting those TFTs to wirings, wirings for electrically connecting the wirings, which are electrically connected to the TFTs, with one another, and wirings connected to gate electrodes and source regions and led out in the pixel region.

It is preferable for long distance wirings to take a large space between adjacent wirings in order to avoid an increase in parasitic capacitance between the wirings. A low resistance material such as copper is preferably used for the material of a long distance wiring.

By placing a multilayer long distance wiring on a short distance wiring, the area the wirings take up can be reduced in view of the projected area.

Embodiment

Figures 2A, 2B, 2C:
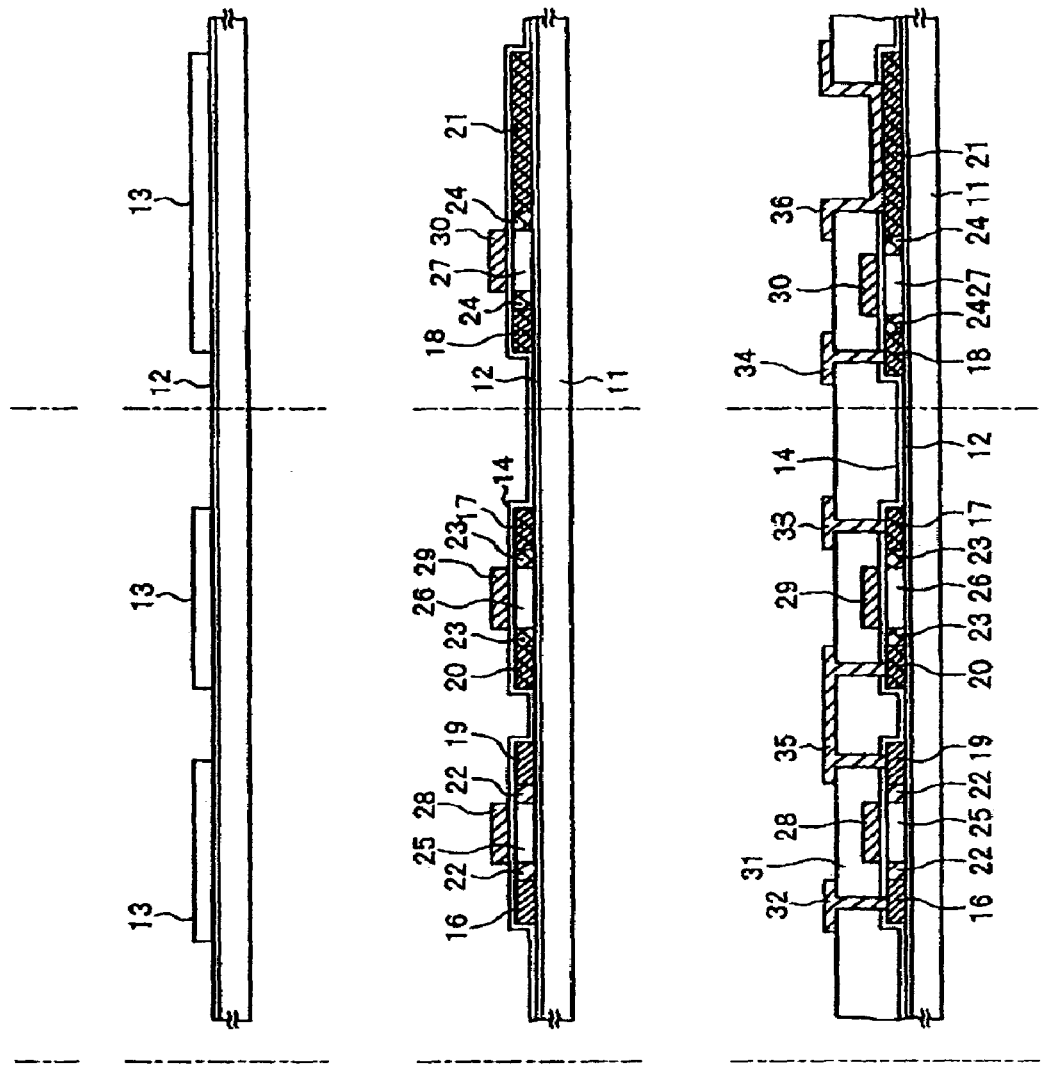
FIGS. 2A to 2C show cross sectional views of a drive circuit region and a pixel region, and a top view of the pixel region of a liquid crystal display device according to the present invention.

FIGS. 2 to 5 show a method of manufacturing a liquid crystal display device according to Embodiment of the present invention Firstly, as shown in sectional views of a driver circuit region and a pixel region in FIG. 2A, a quartz substrate 11 is provided as a substrate, and a silicon oxide film 12 with a thickness of 20 nm is formed thereon. Next, an amorphous silicon film is formed over the silicon oxide film 12.

Note that, in this embodiment, an amorphous silicon film is used; however, other semiconductor films may be used alternatively. For example, a microcrystal silicon film or an amorphous silicon-germanium film may be used. Further, the film is formed so as to have a thickness of from 25 nm to 40 nm in consideration of the following thermal oxidation.

Subsequently, the amorphous silicon film is crystallized. In this embodiment, a technique described in Japanese unexamined patent publication No. 9-312260 is applied as a crystallization method. In the patent publication, an amorphous silicon film is crystallized with solid phase epitaxy using an element selected from the following elements as a catalyst element: nickel (Ni), cobalt (Co), palladium(Pd), germanium (Ge), platinum (Pt), iron (Fe), and copper (Cu).

In this embodiment, Ni is selected as a catalyst element. A layer containing Ni (not shown) is formed on an amorphous silicon film, and heat treatment is performed at 550° C. for 4 hours for the crystallization. Thus, a crystalline silicon (polysilicon) film is formed over the silicon oxide film 12.

Next, after gettering in the crystalline silicon film, a crystalline semiconductor film 13 which is comprised by an active layer only comprised gettering region formed is formed by patterning. Thus, the crystalline semiconductor film 13 with a pattern depicted in FIG. 2A showing a top view thereof is obtained.

Thereafter, as shown in FIG. 2B, a gate insulating film 14 is formed over the crystalline semiconductor film 13 and the silicon oxide film 12 by means of plasma CVD or spattering. The gate insulating film functions as a gate insulating film for a pixel TFT, and N-type TFT and P-type TFT for a driver circuit respectively. In addition, the gate insulating film has a thickness of 50 nm to 200 nm. In this embodiment, a silicon oxide film with a thickness of 75 nm is used. Further, other insulating films containing silicon may be used in a form of a single layer or a multilayer.

After the gate insulating film 14 is formed as above, the silicon oxide (thermal oxide) film with a thickness of from 5 nm to 50 nm (preferably, from 10 nm to 30 nm), which is not shown, is formed at the interface between the crystalline semiconductor film 13 and the gate insulating film 14 by thermal oxidation.

Thereafter, gate electrodes 28 to 30 comprised of a first conductive film is formed over the gate insulating film 14. The gate electrodes 28 to 30 are formed respectively over respective TFTs. In other words, they are formed separately over respective TFTs. In this embodiment, a lamination film of a silicon film (conductivity imparted)/a tantalum nitride film/a tungsten film (or a lamination of a silicon film/a tungsten silicide film in sequence from the bottom) in sequence from the bottom is used for the gate electrodes. Needless to say, other conductive films, for example, a film comprising elements selected from Ta, Ti, Mo, Cu or the like, and a metal alloy or a compound including the above elements as a main component may be alternatively used. Note that the thicknesses of the respective gate electrodes shall be 250 nm.

Further, it is preferable that the silicon film at the bottom be formed using low pressure CVD in the present embodiment. Because a gate insulating film for CMOS circuit, for example, have film thicknesses of as thin as from 5 nm to 30 nm, a semiconductor film (an active layer) could be damaged depending on the conditions when spattering or plasma CVD is carried out. Accordingly, it is preferable to apply thermal CVD which permit film formation by gas-phase chemical reaction.

Next, SiNxOy (generally, x=0.5 to 2, y=0.1 to 0.8) film with a thickness of from 25 nm to 50 nm is formed as a protective film (not shown) so as to cover the gate electrodes 28 to 30. This protective film is formed to protect the gate electrodes 28 to 30 from oxidation. Note that, forming a film in twice is effective and advantageous way to make it pinhole free.

Here, it is also advantageous to perform plasma treatment using hydrogen containing gas (ammonia gas in this embodiment) as a pretreatment for forming the protective film. This pretreatment enables effective hydrogen termination since hydrogen activated (excited) by plasma is confined inside the crystalline semiconductor film.

Next, an impurity doping process is performed to the crystalline semiconductor film 13. Source regions 16 to 18 and drain regions 19 to 21 are formed herewith in the crystalline semiconductor film 13. This step can be performed with either of ion implantation with mass separation or plasma doping without mass separation. Further, conditions of accelerating voltage, dose volume or the like may be set appropriately by an operator.

Subsequently, another impurity doping process is performed to the crystalline semiconductor film 13. In this step, an impurity is doped with lower dose volume than the volume in the foregoing step. Thus, lightly doped regions 22 to 24 are formed in the crystalline semiconductor film 13. This step can be performed with either of ion implantation with mass separation or plasma doping without mass separation. Further, conditions of accelerating voltage, dose volume or the like may be set appropriately by an operator.

This step determines the placement of the source regions 16 to 18, the drain regions 19 to 21, the LDD regions 22 to 24, and the channel forming regions 25 to 27 in a TFT.

Next, heat treatment at a temperature range of 300° C. to 550° C. for 1 to 12 hours is performed in a nitrogen atmosphere. In this embodiment, the heat treatment is performed at a temperature of 410° C. for one hour in a nitrogen atmosphere.

Note that, a protective film formed over the gate electrodes according to the present embodiment is provided to protect the gate electrodes from oxidation in this thermal activation process. However, this protective film is not necessarily provided immediately after the formation of gate electrodes. Accordingly, the same effect can be obtained by thermal activation of impurity elements following the formation of a protective film on a first interlayer insulating film which is formed after gate electrodes are formed.

Thus, after the condition shown in FIG. 2B is obtained, a first interlayer insulating film 31 is formed over the protective film as shown in FIG. 2C. In this embodiment, a silicon oxide film formed by plasma CVD is used for the interlayer insulating film.

Next, contact holes are formed to the first interlayer insulating film 31, a protective film, and a gate insulating film 12, which the contact holes locate over the source regions and the drain regions respectively. Subsequently, a second conductive film is deposited in the contact holes and over the first interlayer insulating film 31; thereafter, the second conductive film is patterned in the contact holes and over the first interlayer insulating film 31. Thus, source electrodes 32 to 34, and drain electrodes 35 and 36 are formed. Thereupon, the source electrodes 32 to 34 are electrically connected to the source regions 16 to 18, and the drain electrodes 35 and 36 are electrically connected to the drain regions 19 to 21 respectively. Thus, a condition shown in FIG. 2C is obtained. Note that, the source electrodes 32 and 33 of the driver circuit region are connected to a wiring (not shown). The drain electrode 35 of the driver circuit region is connected to a wiring (not shown).

Thereafter, as shown in FIG. 3A, a second interlayer insulating film 37 is formed entirely over the surface including the source electrodes and the drain electrodes. A silicon oxide film formed by plasma CVD is used for the second interlayer insulating film 37.

Subsequently, by etching the second interlayer insulating film 37, a drain contact hole 37a is formed over the drain electrode 36 in the interlayer insulating film 37. Note that, the following can be given as an example of the etching method: first, the second interlayer insulating film 37 is coated with a resist film; a resist pattern (not shown) is formed over the second interlayer insulating film by exposing and developing the resist film thereafter; and the second interlayer insulating film is etched by using the resist pattern as a mask. This applies to the etching process described below.

After that, a third interlayer insulating film 38 is formed in the drain contact hole 37a and above the second interlayer insulating film 37. For the third interlayer insulating film 38, a silicon oxide film formed by plasma CVD may be applied. A film comprising other materials formed by other film formation methods may also be applied alternatively. Note that, the third interlayer insulating film 38 functions as a dielectric of a capacitor element in the drain contact hole 37a.

Thereafter, as shown in FIG. 3B, by etching the second and third interlayer insulating films 37 and 38; in the interlayer insulating film, a contact hole is formed over the drain electrode 35 of a TFT in the driver circuit region.

Subsequently, a third conductive film is deposited in the contact hole and over the third interlayer insulating film 38; the third conductive film is patterned thereafter. Thus, a first wiring 39 formed of the third conductive film is formed in the contact hole and over the interlayer insulating film 38; the first wiring 39 is electrically connected to the drain electrode 35. Meanwhile, a first capacitor electrode 40 formed of the third conductive film is formed in the drain contact hole 37a and over the third interlayer insulating film 38 in the pixel region. The first capacitor electrode 40 is connected to a capacitor wiring 40a as shown in the top view of the pixel region in FIG. 3B. The capacitor wiring 40a is formed of the third conductive film.

Figure 4A:
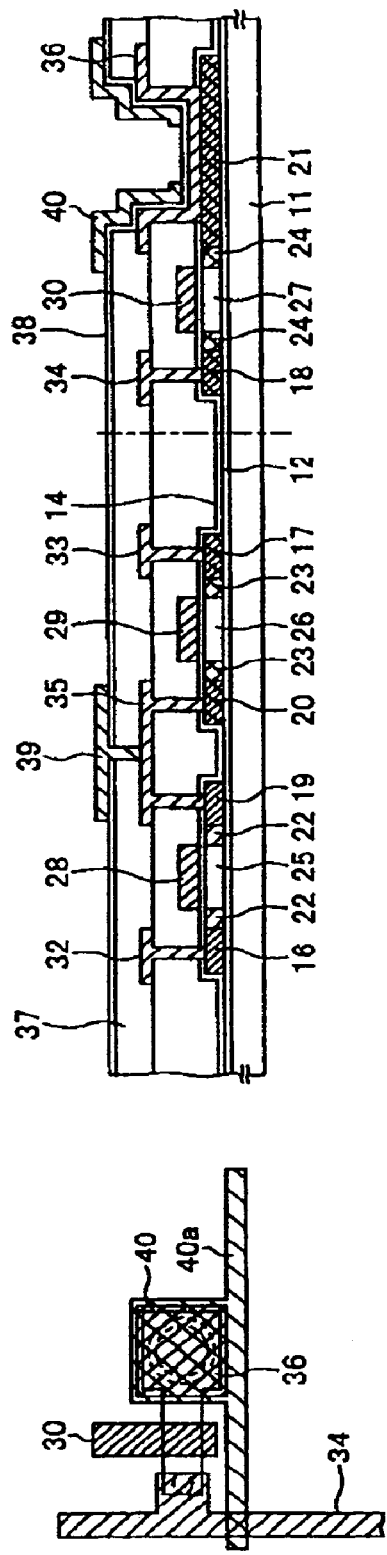
FIGS. 4A and 4B show a step next to the one shown in FIG. 3B, and they show cross sectional views of a drive circuit region and a pixel region, and a top view of the pixel region of a liquid crystal display device.

Next, as shown in FIG. 4A, by etching the first capacitor electrode 40, a part of the bottom of the drain contact hole 37a is exposed. Thus, a first capacitor element is formed in the drain contact hole 37a. Accordingly, the first capacitor element includes the drain electrode 36 which also functions as a capacitor electrode, the third interlayer insulating film 38 which also functions as a dielectric, and the first capacitor electrode 40.

Thus, the first capacitor element is formed in the drain contact hole 37a. Therefore, compared to the existing capacitor wiring, wherein a capacitor element is not formed in a drain contact hole and a wiring is not multi-layered, the capacitor wiring 40a in this embodiment can be made thinner and the aperture ratio of a pixel region can be raised.

Figure 4B:
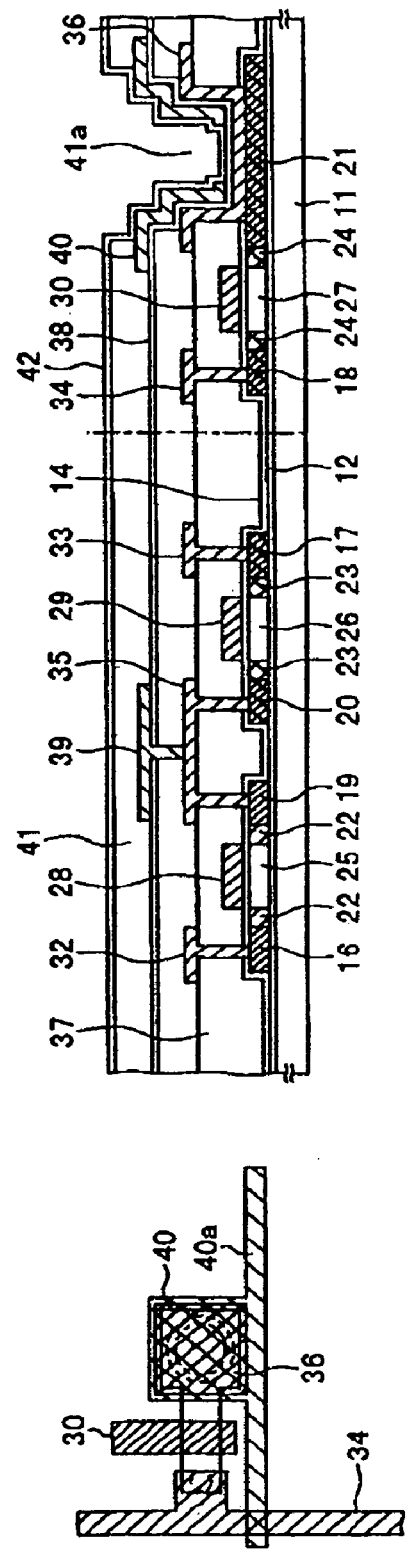

Thereafter, as shown in FIG. 4B, a fourth interlayer insulating film 41 is formed over the first capacitor electrode 40, the first wiring 39 and the third interlayer insulating film 38. For the fourth interlayer insulating film 41, a silicon oxide film formed by plasma CVD may be applied. A film comprising other materials formed by other film formation methods may also be applied alternatively.

Subsequently, by etching the fourth interlayer insulating film 41, a contact hole 41a is formed over the drain contact hole 37a and the first capacitor electrode 40 in the interlayer insulating film 41.

Next, a fifth interlayer insulating film 42 is formed in the contact hole 41a and over the fourth interlayer insulating film 41. For the fifth interlayer insulating film 42, a silicon oxide film formed by plasma CVD may be applied. A film comprising other materials formed by other film formation methods may also be applied alternatively. Further, the fifth interlayer insulating film 42 functions as a dielectric in the contact hole 41a.

Figure 5A:
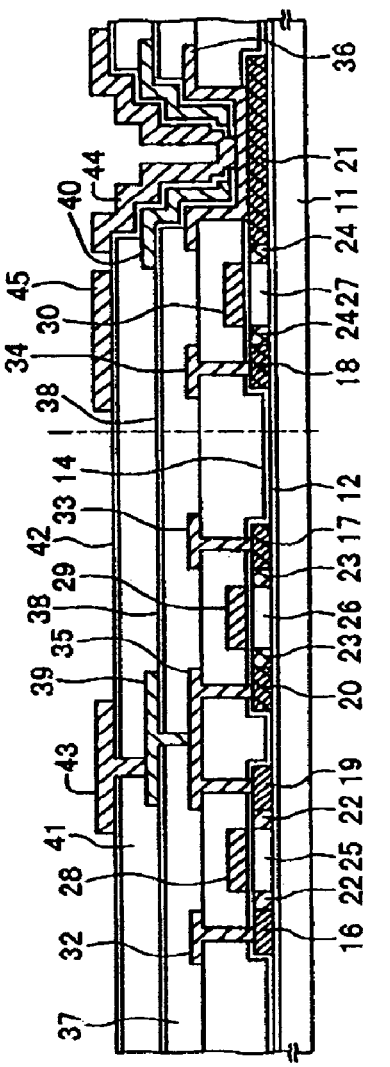
FIGS. 5A and 5B show a step next to the one shown in FIG. 4B, and they show cross sections of a drive circuit region and a pixel region, and a top view of the pixel region of a liquid crystal display device.
Figure 5A:
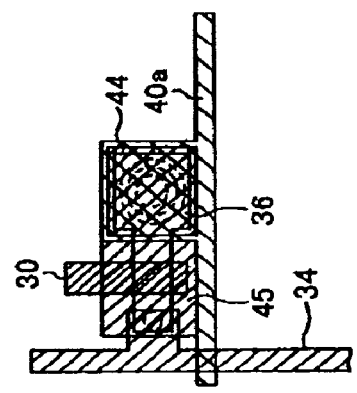

Thereafter, as shown in FIG. 5A, by etching the third and fifth interlayer insulating films 38 and 42 at the bottom of the contact hole 41a, a part of the drain electrode 36 is exposed at the bottom of the contact hole 41a. Then, by etching the fourth and fifth interlayer insulating films 41 and 42, a contact hole is formed over the first wiring 39 in the driver circuit region of the interlayer insulating film. In this embodiment, etching for exposing a part of the drain electrode 36 and etching for forming a contact hole in the driver circuit region are performed separately in respective steps; however, both etching can also be performed in one etching step.

Subsequently, a fourth conductive film is deposited in the contact hole and over the fifth interlayer insulating film 42, and the fourth conductive film is patterned thereafter. Thus, a second wiring 43 formed of the fourth conductive film is formed in the contact hole and over the fifth interlayer insulating film 42 in the driver circuit region, and the second wiring 43 is electrically connected to the first wiring 39. Meanwhile, a second capacitor electrode 44 formed of the fourth conductive film is formed in the contact hole 41a and over the fifth interlayer insulating film 42 in the pixel region; the second capacitor electrode 44 is electrically connected to the drain electrode 36; and a black mask 45 formed of the fourth conductive film is formed over the fifth interlayer insulating film 42 above a pixel TFT in the pixel region.

Thus, a second capacitor element is formed in the contact hole 41a. Accordingly, the second capacitor element includes the first capacitor electrode 40, the fifth interlayer insulating film 42 which also functions as a dielectric, and the second capacitor electrode 44.

Figure 5B:
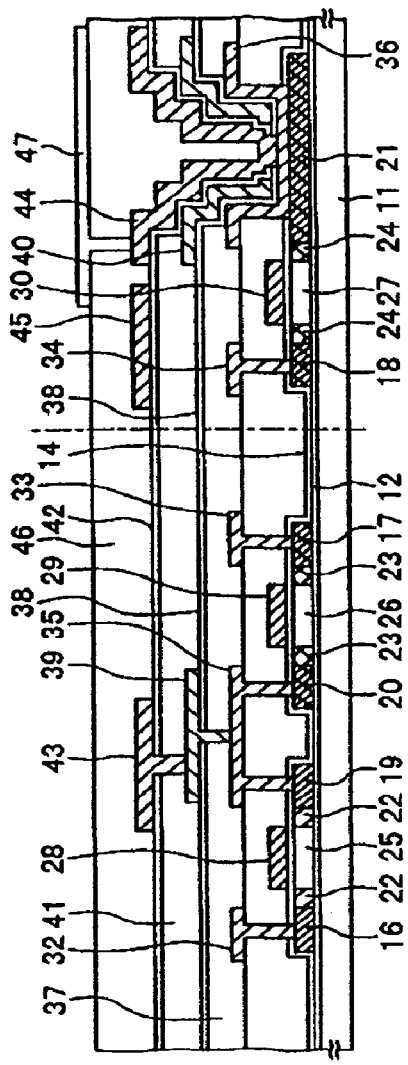
Figure 5B:
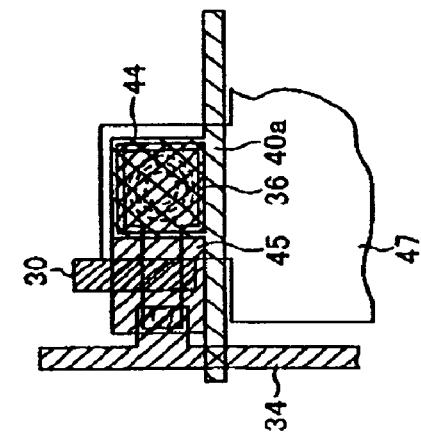
Figure 6:
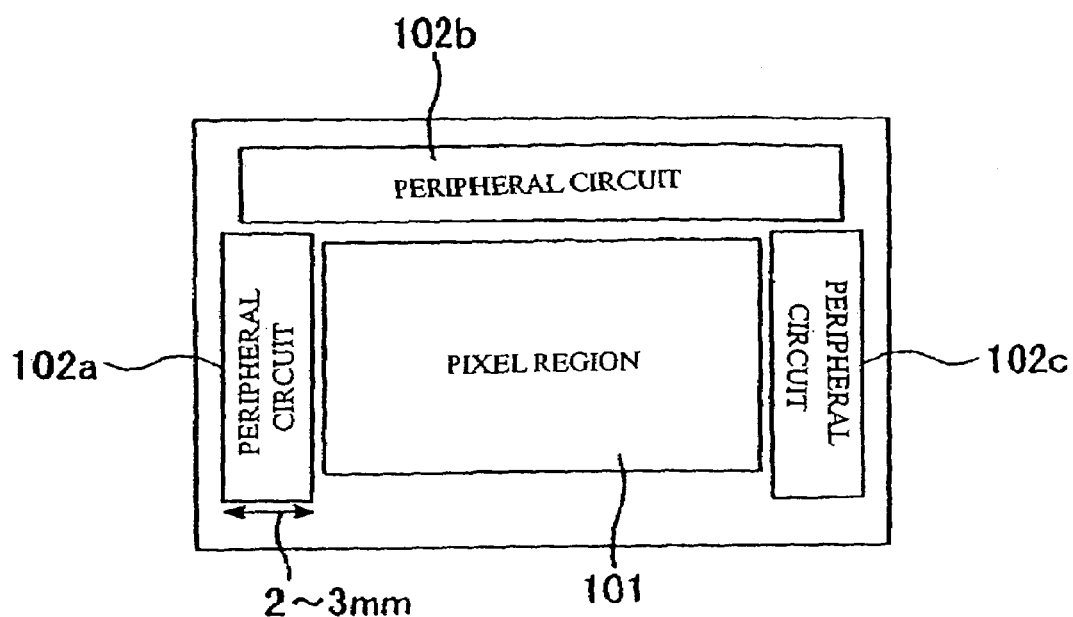
FIG. 6 shows a frame format of a chip in a conventional liquid crystal display device.

Afterwards, as shown in FIG. 5B, a sixth interlayer insulating film 46 is formed over the entire surface including the second wiring 43, the black mask 45, and the second capacitor electrode 44. For the sixth interlayer insulating film 46, an organic resin film such as an acrylic resin film and a polyimide film, or the like may be applied.

Subsequently, the sixth interlayer insulating film 46 is etched. Here, etching is performed by dry etching. A contact hole is herewith formed over the second capacitor electrode 44 in the sixth interlayer insulating film 46.

Thereafter, a conductive film is formed in the contact hole and over the sixth interlayer insulating film 46 by sputtering. Then, by patterning the conductive film, a pixel electrode 47 formed of the conductive film is formed over the sixth interlayer. insulating film in the pixel region. When a transmissive liquid crystal display device is manufactured, a transparent or translucent film, typically, an indium tin oxide (ITO) film is used for the conductive film. On the other hand, when a reflective liquid crystal display device is manufactured, a reflective film, typically, a film composed of Al or Ag, is used. The pixel electrode 47 is electrically connected to the drain electrode 36 through the second capacitor electrode 44.

According to the embodiment above, by giving the area of the driver circuit region a smaller width through multilayer wiring in the driver circuit region, the area of a peripheral circuit region can be reduced without lowering an aperture ratio of the pixel region. Therefore, the pixel size can be increased without changing the chip size of a liquid crystal panel, and the luminance can be improved. Inversely, when the pixel size is unchanged, the chip size of the liquid crystal display panel can be made smaller, thereby improving the productivity.

Further, in addition the width of the peripheral circuits is reduced, the first and the second capacitor elements are formed in the drain contact hole 37a of the pixel TFT in the pixel region. This reduces a dead space in the pixel region, and improves the aperture ratio of the pixel region.

In other words, when a multilayer wiring is applied in the driver circuit region; accordingly, a wiring in the pixel region must also be multilayered. Further, in that case, when capacitor elements are not formed in a drain contact hole 37a, a dead space is formed in the occasion of employing the multilayer wiring in the pixel region. Namely, it is difficult to form a contact hole over another contact hole, so that the contact holes are shifted horizontally and formed. A dead space is formed in consequence. However, by forming the first and second capacitor elements in the drain contact hole 37a of a pixel TFT, the dead space in the pixel region can be reduced and the aperture ratio of the pixel region can also be improved.

Further, in this embodiment, the drain electrode 35, the first and second wirings 39 and 43 as a whole can be a multilayer wiring having a function of a short distance wiring with a short length described in Embodiment Mode 3. Thus, the film thickness of the short distance wiring can be made thinner. By making the short distance wiring into a thin film form, a parasitic capacitance between short distance wirings in one layer can be reduced, so that the parasitic capacitance is not increased although the degree of wiring integration is increased. Accordingly, the causes preventing the high degree of wiring integration the can be lessened.

Further, in this embodiment, the long distance wiring described in Embodiment Mode 3 can be formed on the same layers as the first and second wirings 39 and 43 respectively.

Further, in this embodiment, a wiring is multilayered so as to have two or more layers and the multilayer wiring is arranged on the upper side of the TFT, so that the area of the wiring part can be reduced. Thus, the area of the pixel region can be enlarged without changing the chip size of the liquid crystal panel thereby improving the luminance. Further, when the pixel size is unchanged inversely, the chip size of the liquid crystal display panel can be made smaller and the number of the chips formed over one substrate can be increased, thereby improving the productivity.

Further, in this embodiment, the second to fourth conductive films can be formed of low resistance wiring materials described in Embodiment Mode 1. Thus, the linewidth of the wiring can be made smaller.

Further, in this embodiment, since the capacitor element is formed in the drain contact hole 37a, the width of the capacitor wiring 40a can be made smaller and the aperture ratio of the pixel region can be improved.

Note that, the present invention is not restricted to the above embodiment modes and embodiment, and can be varied in the implementation thereof.

The liquid crystal display device described in the above embodiment can be applied to various displays in electronic appliances. Note that, the electronic appliances are defined as products provided with liquid crystal display devices. As examples of the electronic appliances: a video camera, a still camera, a projector, a projection TV, a head mounted display, a car navigation system, a personal computer (including a notebook type), a personal digital assistant (a mobile computer, a mobile phone or the like) can be given.

As described above, according to the present invention, the area of a peripheral circuit region against a pixel region can be reduced. Further, the aperture ratio of a pixel region can be improved by employing a multilayer wiring and narrowing the width of the peripheral circuit region, thereby gathering the circuits along to the sides of a pixel.

What is claimed is:

1. A method of manufacturing a semiconductor device, comprising:

forming a driver circuit TFT in a driver circuit region over a substrate and a pixel TFT in a pixel region over the substrate; and forming a first wiring over the driver circuit TFT, a second wiring over the first wiring, and a third wiring above the second wiring, and forming a first capacitor element over a drain region of the pixel TFT and a second capacitor element over the first capacitor element.

2. A semiconductor device comprising:

a driver circuit TFT formed in a driver circuit region over a substrate;

a pixel TFT formed in a pixel region over the substrate;

a first wiring formed over the driver circuit TFT;

a second wiring formed over the first wiring;

a third wiring formed over the second wiring;

a first capacitor element formed over a drain region of the pixel TFT; and a second capacitor element formed over the first capacitor element.

3. A method of manufacturing a semiconductor device, comprising:

forming a driver circuit TFT in a driver circuit region over a substrate and a pixel TFT in a pixel region over the substrate;

forming a first interlayer insulating film over the driver circuit TFT and the pixel TFT;

forming a first contact hole in a portion of the first interlayer insulating film that is in the pixel region, the first contact hole being positioned over a drain region of the pixel TFT;

forming, from a first conductive film, a first wiring over a portion of the first interlayer insulating film that is in the driver circuit region, and forming a drain electrode in the first contact hole from the first conductive film;

forming a second interlayer insulating film over the first wiring, the drain electrode and the first interlayer insulating film;

forming a second contact hole in a portion of the second interlayer insulating film that is in the pixel region, the second contact hole being positioned over the first contact hole and the drain electrode;

forming a third interlayer insulating film over the second interlayer insulating film and in the second contact hole;

forming, from a second conductive film, a second wiring over a portion of the third interlayer insulating film that is in the driver circuit region, and forming a first capacitor electrode in the second contact hole from the second conductive film;

partially exposing the third interlayer insulating film at the bottom of the second contact hole by etching the first capacitor electrode;

forming a fourth interlayer insulating film over the second wiring, the first capacitor electrode, and the third interlayer insulating film;

forming a third contact hole in a portion of the fourth interlayer insulating film that is in the pixel region, the third contact hole being positioned over the second contact hole and the first capacitor electrode;

forming a fifth interlayer insulating film over the fourth interlayer insulating film and in the third contact hole;

partially exposing the drain electrode positioned under the bottom of the third contact hole by etching portions of the third and fifth interlayer insulating films that are at the bottom of the third contact hole; and forming, from a third conductive film, a third wiring over a portion of the fifth interlayer insulating film that is in the driver circuit region, as well as forming a second capacitor electrode in the third contact hole from the third conductive film and electrically connecting the second capacitor electrode to the drain electrode, wherein a first capacitor element and a second capacitor element are formed in the first through third contact holes, the first capacitor element being composed of the drain electrode, the third interlayer insulating film as a dielectric, and the first capacitor electrode, the second capacitor element being composed of the first capacitor electrode, the fifth interlayer insulating film as a dielectric, and the second capacitor electrode.

4. A method of manufacturing a semiconductor device according to claim 3, wherein electrically connecting the second capacitor electrode to the drain electrode is followed by forming a sixth interlayer insulating film over the third wiring, the second capacitor electrode, and the fifth interlayer insulating film, and forming, over a portion of the fifth interlayer insulating film that is in the pixel region, a pixel electrode that is electrically connected to the second capacitor electrode.

5. A semiconductor device, comprising:

a driver circuit TFT formed in a driver circuit region over a substrate and a pixel TFT formed in a pixel region over the substrate;

a first interlayer insulating film formed over the driver circuit TFT and the pixel TFT;

a first contact hole formed in a portion of the first interlayer insulating film that is in the pixel region, the first contact hole being positioned over a drain region of the pixel TFT;

a first wiring formed from a first conductive film over a portion of the first interlayer insulating film that is in the driver circuit region;

a drain electrode formed in the first contact hole from the first conductive film;

a second interlayer insulating film formed over the first wiring, the drain electrode and the first interlayer insulating film;

a second contact hole formed in a portion of the second interlayer insulating film that is in the pixel region, the second contact hole being positioned over the first contact hole and the drain electrode;

a third interlayer insulating film formed over the second interlayer insulating film and in the second contact hole;

a second wiring formed from a second conductive film over a portion of the third interlayer insulating film that is in the driver circuit region;

a first capacitor electrode formed in the second contact hole from the second conductive film;

a hole for partially exposing the third interlayer insulating film at the bottom of the second contact hole, the hole being formed in the first capacitor electrode;

a fourth interlayer insulating film formed over the second wiring, the first capacitor electrode, and the third interlayer insulating film;

a third contact hole formed in a portion of the fourth interlayer insulating film that is in the pixel region, the third contact hole being positioned over the second contact hole and the first capacitor electrode;

a fifth interlayer insulating film formed over the fourth interlayer insulating film and in the third contact hole;

a hole for partially exposing the drain electrode positioned under the bottom of the third contact hole, the hole being formed in portions of the third and fifth interlayer insulating films that are at the bottom of the third contact hole; and a third wiring formed from a third conductive film over a portion of the fifth interlayer insulating film that is in the driver circuit region;

a second capacitor electrode formed in the third contact hole from the third conductive film electrically connected to the drain electrode, wherein a first capacitor element and a second capacitor element are formed in the first through third contact holes, the first capacitor element being composed of the drain electrode, the third interlayer insulating film as a dielectric, and the first capacitor electrode, the second capacitor element being composed of the first capacitor electrode, the fifth interlayer insulating film as a dielectric, and the second capacitor electrode.

6. A semiconductor device according to claim 5, further comprising:

a sixth interlayer insulating film formed over the third wiring, the second capacitor electrode, and the fifth interlayer insulating film; and a pixel electrode formed over a portion of the fifth interlayer insulating film that is in the pixel region and is electrically connected to the second capacitor electrode.

* * * * *

UNITED STATES PATENT AND TRADEMARK OFFICE
CERTIFICATE OF CORRECTION

PATENT NO. : 7,122,830 B2 Page 1 of 1
APPLICATION NO. : 10/717562
DATED : October 17, 2006
INVENTOR(S) : Akira Ishikawa and Yasumori Fukushima It is certified that error appears in the above-identified patent and that said Letters Patent is hereby corrected as shown below:

Title page, Item (73) should read:

(73) Assignee:  --SEMICONDUCTOR ENERGY LABORATORY CO., LTD.,
Kanagawa-ken (JP),;
SHARP KABUSHIKI KAISHA, Osaka (JP)--

Signed and Sealed this

Seventeenth Day of July, 2007

JON W. DUDAS
*Director of the United States Patent and Trademark Office*